United States Patent [19]
Dougherty

[11] Patent Number: 6,100,745
[45] Date of Patent: Aug. 8, 2000

[54] COMBINATION POSITIVE TEMPERATURE COEFFICIENT RESISTOR AND METAL-OXIDE SEMICONDUCTOR FIELD-EFFECT TRANSISTOR DEVICES

[75] Inventor: Thomas J. Dougherty, Waukesha, Wis.

[73] Assignee: Johnson Controls Technology Company, Plymouth, Mich.

[21] Appl. No.: 09/131,753

[22] Filed: Aug. 10, 1998

[51] Int. Cl.[7] .................................................. H02H 5/04
[52] U.S. Cl. .......................... 327/512; 327/574; 361/106
[58] Field of Search .................... 327/512, 513, 327/427, 430, 431, 434, 435, 436, 574; 361/106, 91.2, 93.8

[56] References Cited

U.S. PATENT DOCUMENTS

| | | | |
|---|---|---|---|
| 4,717,996 | 1/1988 | Bourke et al. | 363/56 |
| 5,381,296 | 1/1995 | Ekelund et al. | 361/106 |
| 5,619,076 | 4/1997 | Layden et al. | 307/48 |
| 5,666,254 | 9/1997 | Thomas et al. | 361/8 |
| 5,757,141 | 5/1998 | Wood | 315/224 |
| 5,763,929 | 6/1998 | Iwata | 257/467 |
| 5,867,008 | 2/1999 | Du et al. | 320/136 |

FOREIGN PATENT DOCUMENTS

0472405A2  2/1992  European Pat. Off. ......... H02H 9/04

*Primary Examiner*—Tuan T. Lam
*Attorney, Agent, or Firm*—Quarles & Brady LLP

[57] ABSTRACT

The present invention sets forth a new device comprising a PTC, and a transistor in direct physical contact with the PTC. The PTC has a first surface and a second surface wherein at least one of the surfaces is substantially flat. Preferably, the transistor comprises a MOSFET coupled to and located on a flat surface of one of the first and second surfaces of the PTC. The device further includes insulating material coupled to the PTC, a conductive pad coupled to the insulating material, and a conductor coupled between the conductive pad and a gate junction of the transistor. A similar conductive pad and conductor arrangement is provided for a source junction of the transistor. The MOSFET is coupled at a drain junction thereof to one of the first and second surfaces of the PTC, and the device includes a non-conductive encapsulating material around at least a portion of the transistor and the PTC. The combined PTC/MOSFET device provides switching and overload protection features. Alternative embodiments set forth multi-transistor arrangements with a PTC.

15 Claims, 3 Drawing Sheets

COMBINATION POSITIVE TEMPERATURE COEFFICIENT RESISTOR AND METAL-OXIDE SEMICONDUCTOR FIELD-EFFECT TRANSISTOR DEVICES

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention relates to switches and protective devices, and more specifically pertains to combination Positive Temperature Coefficient Resistor (PTC) and Metal-Oxide Semiconductor Field-Effect Transistor (MOSFET) devices providing switching and overload protection service.

Fuses are typically used along with switches, relays, or MOSFETs to provide overload protection and switching services, respectively, for different automotive loads. The switches, relays, or MOSFETs selectively connect and disconnect a power supply to a load. The fuse is provided between the power supply and the load in order to protect the load and, in many cases the switching device, from excessive currents. For example, if an electrical short causes excessively high current to be drawn from the power supply, heat (i.e., $I^2R$ losses) generated by the fuse causes the fuse to burn up (i.e., open circuit). Assuming the fuse is appropriately selected, the fuse open circuits in time to protect the downstream load and the switching device from overload current. A problem with this approach is that burnt out fuses must be replaced which can become costly over the long run as more fuses burn out.

To address the fuse burn out problem, the industry has employed Positive Temperature Coefficient Resistors (PTCs) in place of fuses. (See U.S. Pat. Nos. 4,717,996; 5,619,076; and 5,757,141). PTCs are well known functional analogues of circuit breakers. In general, PTC resistance increases dramatically as a PTC threshold temperature is exceeded. The increased resistance resembles an open circuit, thereby cutting off current and protecting the PTC, a series switch and downstream components. Having a PTC connected in series with a MOSFET in the same electrical system is known (see U.S. Pat. Nos. 4,717,996; 5,619,076; and 5,757,141).

Unfortunately, there are many instances wherein a PTC will not be able to protect a series switching device from thermal damage. For example, if an input control signal to a MOSFET's gate has an excessive delay in transitioning from low to a high, turn-on voltage (i.e., its rising time is too long), the delay slows the MOSFET conduction and the MOSFET heats up. Second, if the MOSFET is to conduct a relatively high current, but the gate's input control voltage is too low to fully turn on the MOSFET, the MOSFET will heat up. Third, a MOSFET heats up when it operates continuously over long duration at abnormally high ambient temperature.

Regardless of the cause of heat generation in a MOSFET, limitation of MOSFET temperature is necessary to avoid device destruction. One approach to minimize MOSFET heating is to provide a heat sink. Another well known technique involves using circuitry to monitor MOSFET operation and modify MOSFET operation when a threshold temperature is approached. Significant problems exist under both of these approaches regardless of whether a PTC or a fuse is used with the MOSFET to provide the overload function. For the purpose of simplifying this discussion, and not to limit the scope of the present invention, unless specified otherwise hereinafter, the remainder of this specification will be presented in the context of a MOSFET/PTC configuration.

With respect to the heat sink approach, three separate devices are required: 1) a PTC; 2) a MOSFET; and 3) a heat sink. In addition to being costly, many heat sinks are relatively large devices and therefore require additional system space. Thus, if possible, it would be desirable to eliminate or at least substantially reduce the size of any required heat sink.

Another problem associated with the heat sink technique rests in the fact that the PTC and MOSFET are located apart from one another. For example, assuming that the MOSFET and an associated heat sink are located in a region of high ambient temperature, the elevated temperature may inhibit effective heat transfer away from the MOSFET. In this case, PTC tripping is the only hope for protecting the MOSFET from overheating.

Three factors affect a PTC's thermal trip point including the PTC's threshold temperature and variance, the ambient temperature of the PTC's environment, and the PTC's $I^2R$ heat generation. The PTC's threshold temperature and variance are fixed once the PTC is selected for a system, so the impact of the threshold temperature and variance on the trip point is also fixed. In addition, since the PTC is apart from the MOSFET, it may well be in a region of lower ambient temperature than the MOSFET. Assuming a PTC is in a lower temperature environment than the MOSFET, ambient temperature has less impact on PTC temperature than would otherwise be the case if the PTC and MOSFET were located in the same region of high ambient temperature. Moreover, current from the MOSFET to the PTC may be insufficient to generate enough $I^2R$ heat, in combination with the PTC's slight ambient temperature heat build up, to trip the PTC and protect the MOSFET. Thus, it would be advantageous to have: 1) a PTC located in close proximity to the MOSFET, and therefore, in the same ambient temperature region as the MOSFET; and 2) to provide heat input to the PTC supplementing its ambient and $I^2R$ heat inputs in order to ensure that it trips in time to protect the MOSFET.

The monitoring circuitry approach to limiting MOSFET heating also has shortcomings. The monitoring circuitry requires use of system space in addition to that required for the PTC and MOSFET. Also, the monitoring circuitry increases the cost associated with an overall system. Additionally, if the monitoring circuitry is unable to adequately control the MOSFET's heat build up, then reduction of current through the MOSFET caused by tripping the PTC may be the only way to protect the MOSFET. However, since the PTC and MOSFET are located apart from one another, the problem of having the MOSFET in a region of higher ambient temperature than that for the PTC still exists. In other words, the PTC may be in a region of relatively low ambient temperature, and it therefore may not be able to reach its thermal trip point before MOSFET damage occurs. Also, the PTC still has only two heat inputs to help it reach its thermal trip point in order to protect an overheating MOSFET.

Thus, there existed a need for a simple, inexpensive switching configuration which protects against excessive current and also protects an associated switch from thermal destruction.

BRIEF SUMMARY OF THE INVENTION

In general, the present invention provides at least one transistor, such as a MOSFET, which is positioned proximate the MOSFET so that heat generated by the MOSFET effects the temperature of the PTC. Preferably, the MOSFET is in direct physical contact with a PTC. Note that whether a MOSFET and PTC are in direct physical contact or not, the MOSFET provides a switching function, and the PTC operates as a circuit protective device (e.g., a circuit breaker type device). Combining a PTC in direct physical contact with a MOSFET (although more than one MOSFET may be used in the present invention) provides new, unexpected advantages over the art. As the MOSFET heats up for any one of a variety of reasons, some of its thermal energy is directly conducted to the PTC (since they are in direct physical and thermal contact) causing the PTC to heat up. By selecting a PTC with an appropriate threshold temperature, the PTC will "trip" (i.e., its resistance will rapidly increase) to limit current through the MOSFET, thereby permitting it to cool down and avoid thermal self-destruction. The PTC protects not only the MOSFET, but also loads downstream of the combined PTC/MOSFET device.

One embodiment of the present invention discloses a device comprising a PTC, and a transistor coupled to the PTC such that heat generated by the transistor increases PTC temperature. For example, the transistor may be in direct physical contact with the PTC. The PTC has a first surface and a second surface wherein at least one of the surfaces is substantially flat. Preferably, the transistor comprises a MOSFET located on a flat surface of one of the first and second surfaces. Usually, the transistor is not only in contact with but also coupled to the PTC. The device further includes insulating material coupled to the PTC, a conductive pad coupled to the insulating material, and a conductor coupled between the conductive pad and a gate junction of the transistor. The insulating material may comprise either a single, contiguous section, or a plurality of sections. The device also includes another conductive pad coupled to the insulating material (whether using one or more sections of insulating material), and another conductor coupled between the other conductive pad and a source junction of the transistor. Yet another conductive pact is coupled to one of the first and second surfaces other than one on which the MOSFET is located, and the MOSFET is coupled at a drain junction thereof to one of the first and second surfaces of the PTC. Lastly, the device further comprises a non-conductive encapsulating material around at least a portion of the transistor and the PTC.

In an alternative embodiment of the present invention, a device is disclosed comprising a PTC, and a plurality of transistors coupled to the PTC such that heat generated by the transistors increases PTC temperature. For example, the transistors may be in direct physical contact with the PTC. The PTC has a first surface and a second surface wherein at least one of the surfaces is substantially flat. The plurality of transistors preferably comprises a plurality of MOSFETs, wherein at least one MOSFET is located on a flat surface of the first surface, and at least one MOSFET is located on a flat surface of the second surface. Usually, the plurality of transistors is not only in contact with but also coupled to the PTC. The device further includes insulating material coupled to the PTC, a first conductive pad coupled to the insulating material, a first conductor coupled between the first conductive pad and a gate junction of a first transistor, a second conductive pad coupled to the insulating material, and a second conductor coupled between the second conductive pad and a gate junction of a second transistor. As in the previous embodiment of the present invention, the insulating material may comprise a single, contiguous section, or more than one section of insulating material. The device further includes another conductive pad coupled to the insulating material, another conductor coupled between this conductive pad and a source junction of a first transistor, yet another conductive pad coupled to the insulating material, and yet another conductor coupled between its corresponding conductive pad and a source junction of a second transistor. Each MOSFET located on the first surface is coupled at a drain junction thereof to the first surface, and each MOSFET located on the second surface is coupled at a drain junction thereof to the second surface. Lastly, the device further comprises a non-conductive encapsulating material around at least a portion of the plurality of transistors and the PTC.

A variant of the second embodiment defines a plate associated with one of the first and second surfaces that is cut into a plurality of sections, and another plate associated with the other of the first and second surfaces that is uniform or undivided. At least two of the sections are each coupled to at least one transistor.

Each embodiment of the present invention provides a number of objects and advantages over the prior art. Such objects and advantages include: 1) providing improved switching and overload protection devices; 2) replacing three separate devices (e.g., a MOSFET, its heat sink, and a PTC or fuse) with a single, combined device, thereby reducing system space and cost requirements; 3) facilitating MOSFET heat removal by using the PTC as a heat sink; 4) using MOSFET heat as an additional thermal input to the PTC in order to reduce the occurrence of MOSFET overheating; and 5) providing improved means for simultaneously charging a bank of batteries.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefor, to the claims herein for interpreting the scope of the invention.

DETAILED DESCRIPTION OF THE INVENTION

Figure 1:
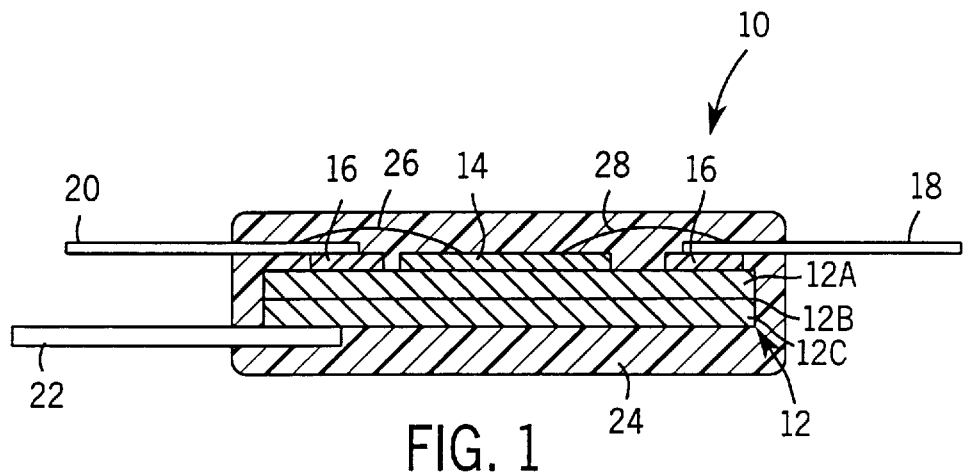
FIG. 1 is a simplified, cross-sectional view of a component layout for one embodiment of the present invention.

Referring to FIG. 1, a simplified, cross-sectional view of a component layout for one embodiment of the present invention is shown and generally designated by reference number 10. In its simplest form, device 10 includes PTC 12 and transistor 14. PTC 12 includes conductive plates 12A and 12C, having polymeric material 12B in between. In general, PTC 12 operates as a conducting device; however, when its temperature rises above its threshold level, polymeric material 12B expands to a point that PTC 12 resembles a high resistance circuit. PTC 12 is in contact with transistor 14. In the preferred embodiment, transistor 14 comprises a MOSFET device of any polarity type. While MOSFET 14 is in direct physical contact with PTC 12, the two are typically not only in contact with each other, but also physically coupled or connected to each other. Insulating material 16 is also coupled to PTC 12. Note that in FIG. 1, insulating material 16 is shown in more than one region; however, in FIG. 2 insulating material 16 is shown as a single region. The present invention includes insulating material in one or more locations in device 10. One region of insulating material 16 is connected to a conducting bar 20, while another region of insulating material 16 is connected to a conducting bar 18. Conducting bar 20 is connected to MOSFET 14 via a conductor 26, while conductive bar 18 is coupled to MOSFET 14 via conductor 28.

Figure 2:
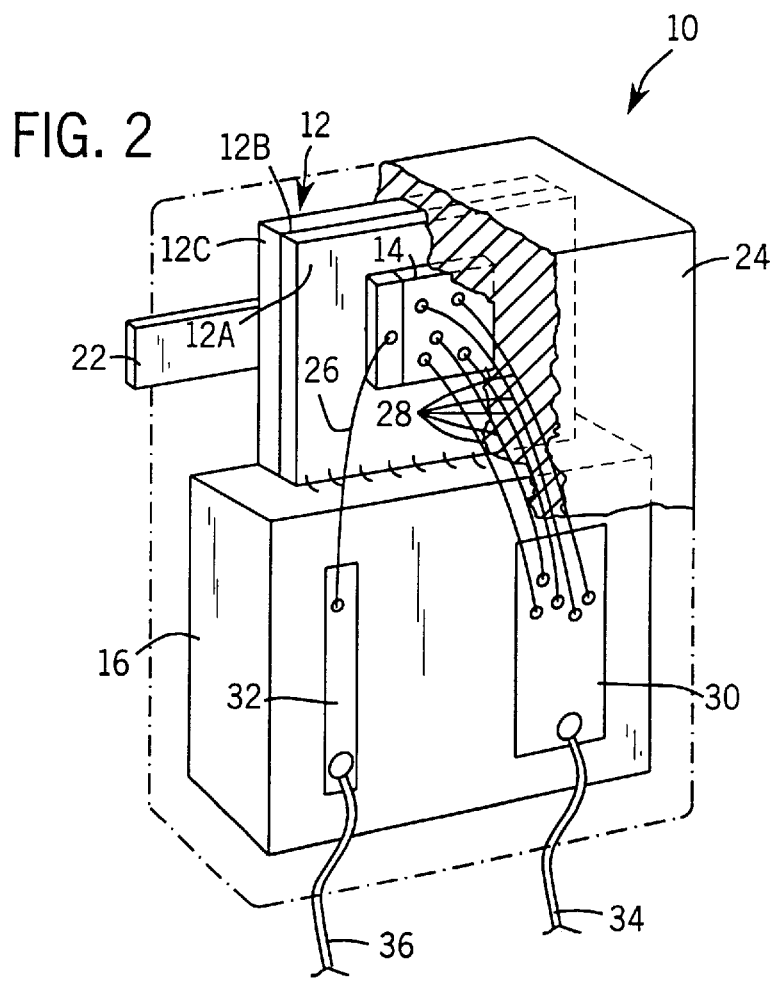
FIG. 2 is a simplified, perspective view showing one manner of making the device of FIG. 1.

Conductor 26 is coupled to the gate junction for MOSFET 14 while conductor 28 is connected to the source junction for MOSFET 14. Note that in FIG. 2, conductor 28 is shown as a plurality of conductors. This is shown to indicate that more than one conductor may be required to carry large current. The scope of the present invention is intended to cover one or more conductors for 26 or for 28, as required by the situation. The drain junction of MOSFET 14 makes physical contact with a surface of PTC plate 12A. Conductive bar 22 is coupled to a surface of PTC plate 12C. Preferably, MOSFET 14, PTC 12, and portions of their interconnections are enclosed with a non-conductive, encapsulating material 24. Referring to FIG. 2, note that conductive bar 20 (from FIG. 1) is replaced by a bonding pad 32 connected to conductors 26 and 36. Similarly, conducting bar 18 (from FIG. 1) is replaced by conductive pad 30 connected to conductors 28 and 34. Use of conductive bars, bonding pads, and equivalents thereof is considered within the scope of the present invention.

Referring to FIGS. 1 and 2, device 10 may be produced in the following manner shown by way of example only, since those skilled in the art understand that alternative materials and methods may be used to produce device 10. A device similar to device 10 may be produced using materials including the following: 1) an 11 amp, 24 mm×24 mm PTC manufactured by Bourns Corporation under Part Number MF-1100; 2) a MOSFET dye manufactured by International Rectifier under Part Number IRL3803; 3) a phenol ceramic substrate or any other insulating material suitable for high temperature operation; 4) conducting wires preferably made from aluminum, silver, or gold; and 5) a nonconductive, soft epoxy such as GLOB TOP protective coating. As mentioned, MOSFET 14 is not only in contact with, but preferably also connected to PTC 12. This is typically done using a reflowing-type process. Those skilled in the art understand that alternative means of connecting MOSFET 14 to PTC 12 are possible, such as clamping MOSFET 14 to PTC 12. If MOSFET 14 were merely clamped to PTC 12, then MOSFET 14 would typically comprise a MOSFET die enclosed in package form such that the clamping means would be insulated from the internal MOSFET die, while having an open face for the drain junction of the MOSFET die to make electrical contact with PTC 12. Yet, in the preferred embodiment, MOSFET 14 comprises a MOSFET die (i.e., not encapsulated), and the MOSFET die is physically coupled to PTC 12 through reflowing. Those skilled in the art understand that MOSFET 14 can be coupled to PTC 12 in any manner well known to those skilled in the art.

The phenol ceramic substrate (i.e., insulating material 16, whether it be located in one or more regions) is connected to PTC 12 in any one of a number of manners well known to those skilled in the art, such as use of an adhesive material. Next, conductive wires (i.e., 26 and 28) are connected between their respective MOSFET junctions and their respective bonding or conductive pads, or conductive bars, in any one of a number of manners well known to those skilled in the art. A conductive pad or bar (i.e., 22) is also coupled in any one of a number of manners well known to those skilled in the art to PTC plate 12C. Device 10 is enclosed in a non-conductive, soft epoxy, protective coating 24, such as GLOB TOP. Note that in FIG. 2, protective coating 24 is shown broken away to reveal device 10 internals. Then, device 10 is cured in any one of a number of manners well known to those skilled in the art in order to set protective coating 24.

Figure 3:
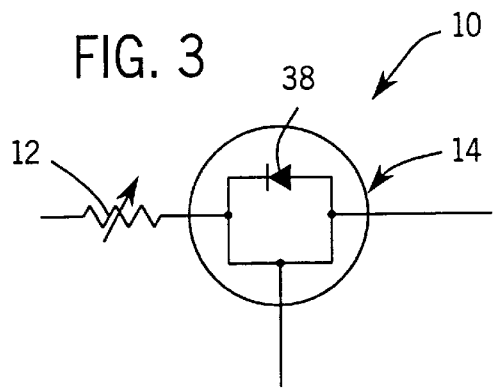
FIG. 3 is a simplified, electrical schematic of the device from FIGS. 1 and 2.

Before turning to the specific operation of device 10, note that FIG. 3 shows a simplified, electrical schematic of device 10 including PTC 12 and MOSFET 14 having a parasitic diode 38. Referring to FIG. 1, a control input for MOSFET 14 is connected to conductive bar 20, while the source input is connected to conductive bar 18, and the drain connection is made at conductive bar 22. Once connected, MOSFET 14 of device 10 operates like a typical MOSFET device to provide switching service. For example, when an appropriate control signal is supplied to the gate junction of MOSFET 14 via conductive bar 20, power flows from a power supply (not shown) through conductive bar 18, through the source and drain junctions of MOSFET 14, through PTC 12, and through conductive bar 22 to a load (not shown). Device 10 provides more than mere switching capabilities. Specifically, if MOSFET 14 was to attempt thermal runaway, heat generated in MOSFET 14 would be directly conducted to PTC 12. Then, assuming PTC 12 is appropriately selected (i.e., having a an appropriately selected threshold temperature), then PTC 12 would open circuit in order to protect both MOSFET 14 and its downstream load. In addition, device 10 protects the downstream load in situations other than thermal runaway of MOSFET 14. In particular, should an electrical short develop in MOSFET 14, or elsewhere, excessive current flow through PTC 12 will cause it to heat up and transition into a high resistance mode in order to protect the downstream load, and perhaps even MOSFET 14. Thus, device 10 combines switching and overload features in a single package.

Figure 4:
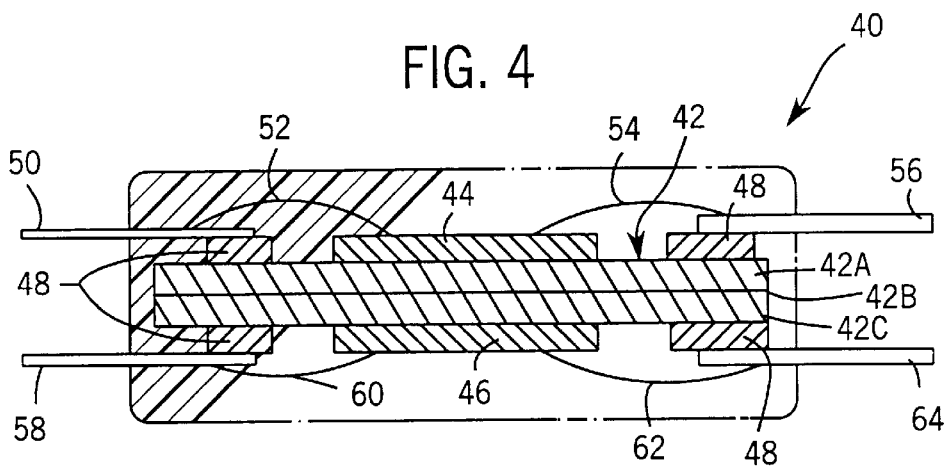
FIG. 4 is a simplified, cross-sectional view of a component layout for another embodiment of the present invention.

Referring to FIG. 4, a simplified, cross-sectional view of a component layout for another embodiment of the present invention is shown and generally designated by reference number 40. Device 40 includes PTC 42 having conductive plates 42A and 42C with a polymeric material 42B there between. A plurality of transistors 44 and 46 are in direct physical contact with PTC 42. PTC 42 has first and second surfaces wherein at least one of the surfaces is substantially flat, and in the preferred embodiment, each are substantially flat. Note also that in the preferred embodiment, transistors 44 and 46 comprise MOSFET devices of any desired polarity. MOSFET 44 is not only in direct physical contact, but also directly connected to one surface of PTC 42. MOSFET 46 is similarly directly connected to an opposing surface of PTC 42. Insulating material 48 is also connected to the surfaces of PTC 42 as shown. Conducting bars 50, 56, 58, and 64 are each connected to insulating material 48. Conducting bar 50 has a conductor 52 connected between itself and a gate junction of MOSFET 44. Similarly, conducting bar 58 has a conductor 60 connected between itself and the gate junction for MOSFET 46. Conductive bar 56 is coupled to the source junction for MOSFET 44 via conductor 54, while conductive bar 64 is coupled to the source junction of MOSFET 46 via conductor 62. Note that conductive bars 50, 56, 58, and 64 are shown by way of example only, as those skilled in the art understand that conductive pads, bars, and other equivalent conductors may be used in the present invention. What is important here is that electrically conductive paths be established for the control and source junctions of MOSFETs 44 and 46 with the world located outside device 40. Device 40 is also enclosed with a non-conductive, encapsulating material. Device 40 is preferably made using materials and methods similar to those defined for device 10, or other materials and methods of manufacture well known to those skilled in the art.

Figure 5:
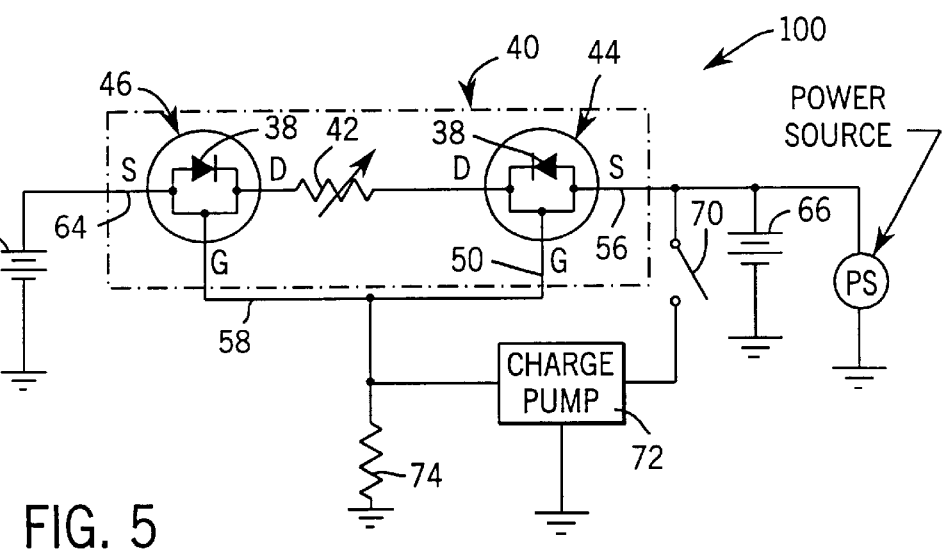
FIG. 5 is a simplified, electrical schematic showing the device from FIG. 4 incorporated into a system for simultaneously charging a bank of batteries.

Referring to FIG. 5, a simplified, electrical schematic shows device 40 from FIG. 4 incorporated into a system 100 for simultaneously charging a bank of batteries 66 and 68. System 100 includes a pair of batteries 66 and 68, a power source, a charge pump 72, switch 70, loading resistor 74, and device 40. With switch 70 open, the power source can charge battery 66 separately. Alternatively, with switch 70 closed, charge pump 72 raises the potential at the gate junctions of MOSFETs 44 and 46 above their turn-on threshold levels. Any charge pump well known to those skilled in the art may be used. Now with both MOSFETs 44 and 46 turned on, the power source simultaneously charges batteries 66 and 68. One might ask why device 10 of FIG. 1 may not be used in system 100. If device 10 were used in system 100, then its parasitic diode 38 (see FIG. 3) would permit inter-battery discharge. Using device 40 in system 100, MOSFETs 44 and 46 provide a pair of opposing parasitic diodes 38. As such, inter-battery discharge is prevented. An alternative embodiment of system 100 would include a motor generator, such as an alternator found in an automotive vehicle, in place of one of batteries 66 and 68. Additionally, in this alternative embodiment of system 100, the power source would be removed. Under either embodiment of system 100, use of device 40 provides switching and overload protection services having advantages analogous to those disclosed with respect to device 10 from FIGS. 1 through 3.

Figure 7:
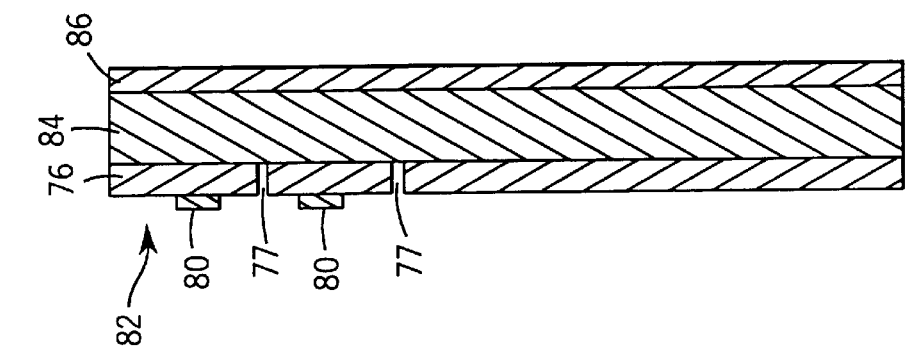
FIG. 7 is a cross-sectional view taken along line 7—7 of FIG. 6.
Figure 6:
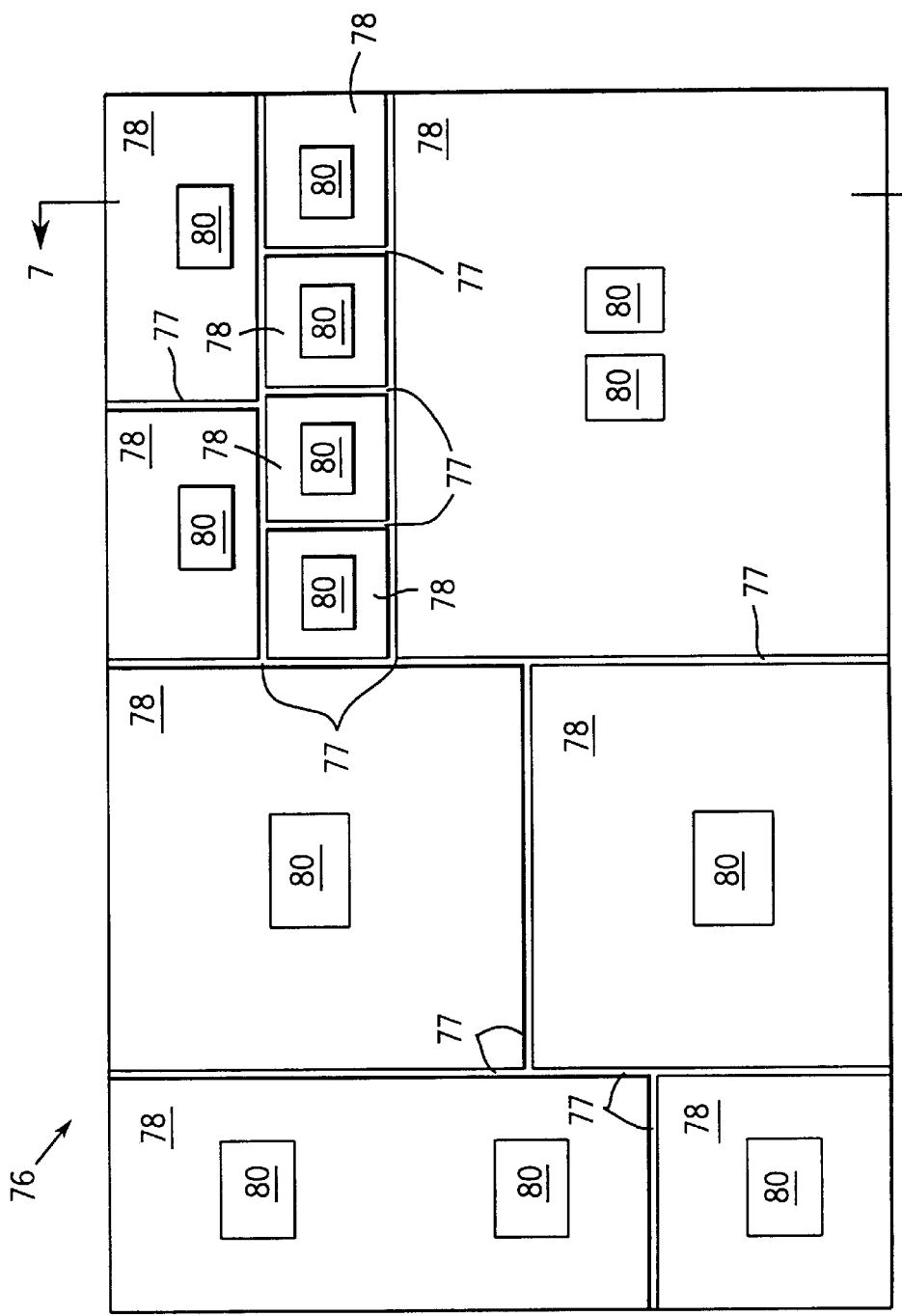
FIG. 6 is a simplified, plan view of yet another embodiment of the present invention showing a PTC plate divided into a plurality of regions including one or more MOSFETs.

Referring to FIGS. 6 and 7, yet another embodiment of the present invention is shown and generally designated by reference number 82. Like device 40, device 82 also includes a plurality of MOSFETs in direct physical contact with a PTC; however, in device 82, the MOSFETs are located on the same side of the PTC. Specifically, and with reference to FIG. 7, note that the PTC comprises conductive plates 76 and 86 having a polymeric material 84 there between. MOSFETs 80 are located only on PTC plate 76, as shown in FIGS. 6 and 7. Note that in FIG. 6, PTC plate 76 is partitioned or cut along lines 77 into a plurality of separate regions 78. Since regions 78 are formed by cutting plate 76, each region 78 is isolated from the others. Given this arrangement, a number of possibilities result. Any number of the plurality of regions 78 of PTC plate 76 could have zero, one, or more MOSFETs 80 located thereon. Since each of the regions 78 of PTC plate 76 are isolated from one another, each MOSFET within a particular region 78 is isolated from the MOSFETs 80 in the other regions 78 on PTC plate 76.

Device 82 is preferably made using materials and methods of manufacture similar to those discussed with respect to devices 10 and 40, or other materials and methods well known to those skilled in the art. In this regard, note that the insulating material and associated conductors and bonding wires required to connect MOSFET gate, source, and drain junctions to the world outside of device 82 are not shown for the sake of simplifying the drawing. Nevertheless, each MOSFET 80 used in device 82 would be provided with gate, source, and drain connection analogous to that previously disclosed. Note that most of the regions 78 of PTC plate 76 includes a single MOSFET 80. Some regions 78 include a pair of MOSFETs 80. Pairs of MOSFETs 80 are used to supply loads requiring more power than could be efficiently supplied by a single MOSFET 80. Pairs of MOSFETs 80 can be connected in series or in parallel, as appropriate. Assuming space availability, any region 28 may have any number of MOSFETs 80.

Device 82 is used to provide switching and overload protection services for a variety of loads. Specifically, each region 78, whether it includes one or more MOSFETs 80 connected in series or in parallel, provides one or MOSFETs 80 in direct physical contact with the PTC. Each of these regions 78 can supply its own load. Thus, each regions' MOSFET(s) 80 would include source, gate, and drain connection(s). The source connection(s) would be made to a power supply, while the gate connection(s) would be made to a control input, and the drain connection(s) would be made to the load corresponding to the MOSFET(s) 80 of the given region 78. The plurality of control inputs to the gate junctions of device 82 could be provided in any one of a number of manners well known to those skilled in the art. For example, a touch pad could be provided wherein one simply presses an appropriate touch pad button in order to turn on a particular load. Alternatively, voice activation means could be used to selectively power a load. Device 82 has broad application, but is particularly well suited for use in automobiles or other vehicles to replace their present fuse box and switching network. By way of example, assume device 82 was used in an automobile. Using a voice recognition system, a driver could simply state "open right window" and the voice recognition system would provide a control input to the gate junction of an appropriate MOSFET 80 in order to open the selected window. When the window is open to the appropriate level, the driver would simply say "stop opening" and the voice recognition system would secure the control input on the gate junction of the selected MOSFET 80, thereby terminating the opening motion of the selected window. Since device 82 includes a number of regions 78 with one or more MOSFETs 80, it could be used to control a variety of loads within the automobile. Also, like devices 10 and 40, note that device 82 includes a non-conductive, encapsulating material around MOSFETs 80 and the PTC. Additionally, note that the cuts 77 between regions 78 could be filled with an insulating material.

It should be understood that the methods and apparatuses described above are only exemplary and do not limit the scope of the invention, and that various modifications could be made by those skilled in the art that would fall under the scope of the invention. For example, in each of the devices 10, 40, and 82, one or more regions of insulating material may be used. Similarly, each devices' MOSFET(s) requires source, gate, and drain connections outside of the device. This can be accomplished in any one of a number of manners well known to those skilled in the art to include: bonding pads, conductive bars, pins, or wires.

To apprise the public of the scope of this invention, the following claims are provided:

What is claimed:

1. A device providing switching and overload protection service for a load, said device comprising:

a positive temperature coefficient resistor having a first surface and a second surface;

a transistor electrically coupled to said positive temperature coefficient resistor so that when the transistor is conducting, current which passes through the transistor also passes through the positive temperature coefficient resistor;

insulating material coupled to said positive temperature coefficient resistor;

a conductive pad coupled to said insulating material; and a conductor coupled between said conductive pad and a gate junction of said transistor;

the positive temperature coefficient resistor positioned to be in direct physical contact with the transistor such that heat generated by the transistor increases the positive temperature coefficient resistor's temperature.

2. The device of claim 1 wherein said transistor comprises a MOSFET coupled in direct physical contact with said positive temperature coefficient resistor PTC.

3. The device of claim 1 wherein at least one of the first and second surfaces is essentially flat and said transistor comprises a MOSFET located on the flat surface.

4. The device of claim 1 further including:

insulating material coupled to said positive temperature coefficient resistor PTC;

a conductive pad coupled to said insulating material; and a conductor coupled between said conductive pad and a source junction of said transistor.

5. The device of claim 2 further including a conductive pad coupled to one of said first and second surfaces other than one on which said MOSFET is located.

6. The device of claim 2 wherein said MOSFET is coupled at a drain junction thereof to one of said first and second surfaces of said positive temperature coefficient resistor PTC.

7. The device of claim 1 further comprising a non-conductive encapsulating material around at least a portion of said transistor and said positive temperature coefficient resistor PTC.

8. A device providing switching and overload protection service for a load, said device comprising:

a positive temperature coefficient resistor having a first surface and a second surface, wherein a plate associated with one of said first and second surfaces is cut into a plurality of separate sections, and another plate associated with the other of said first and second surfaces is uniform; and a plurality of transistors wherein at least one of the transistors is electrically coupled to said positive temperature coefficient resistor so that when the at least one of the transistors is conducting, current which passes through the conducting transistor also passes through the positive temperature coefficient resistor;

the positive temperature coefficient resistor positioned to be in direct physical contact with the plurality of transistors such that heat generated by the transistors increases the positive temperature coefficient resistor's temperature.

9. The device of claim 8 wherein said plurality of transistors comprises a plurality of MOSFETs coupled in direct physical contact with said positive temperature coefficient resistor PTC.

10. The device of claim 8 wherein at least one of the first and second surfaces is essentially flat, the transistors are MOSFETs and at least one MOSFET is located on the flat surface.

11. The device of claim 8 further including:

insulating material coupled to said positive temperature coefficient resistor;

a first conductive pad coupled to said insulating material;

a first conductor coupled between said first conductive pad and a gate junction of a first transistor of said plurality of transistors;

a second conductive pad coupled to said insulating material; and a second conductor coupled between said second conductive pad and a gate junction of a second transistor of said plurality of transistors.

12. The device of claim 8 further including:

insulating material coupled to said positive temperature coefficient resistor;

a first conductive pad coupled to said insulating material;

a first conductor coupled between said first conductive pad and a source junction of a first transistor of said plurality of transistors;

a second conductive pad coupled to said insulating material; and a second conductor coupled between said second conductive pad and a source junction of a second transistor of said plurality of transistors.

13. The device of claim 10 wherein each MOSFET located on said first surface is coupled at a drain junction thereof to said first surface, and wherein each MOSFET located on said second surface is coupled at a drain junction thereof to said second surface.

14. The device of claim 8 further comprising a non-conductive encapsulating material around at least a portion of said plurality of transistors and said positive temperature coefficient resistor PTC.

15. The device of claim 8 wherein at least two of said sections are each coupled to at least one transistor.

* * * * *